(12) United States Patent
Lin et al.

(10) Patent No.: US 9,350,375 B1
(45) Date of Patent: May 24, 2016

(54) METHOD AND SYSTEM FOR PERFORMING ANALOG-TO-DIGITAL CONVERSION

(71) Applicant: NXP B.V., Eindhoven (NL)

(72) Inventors: Yu Lin, Utrecht (NL); Frank Leong, Veldhoven (NL); Konstantinos Doris, Amsterdam (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/685,501

(22) Filed: Apr. 13, 2015

(51) Int. Cl.
*H03M 1/36* (2006.01)
*H03M 1/12* (2006.01)
*H03M 1/00* (2006.01)

(52) U.S. Cl.
CPC ............ *H03M 1/1245* (2013.01); *H03M 1/002* (2013.01); *H03M 1/12* (2013.01)

(58) Field of Classification Search
CPC ...... H03M 1/1245; H03M 1/12; H03M 1/002
USPC .................................................. 341/155, 159
See application file for complete search history.

(56) References Cited

U.S. PATENT DOCUMENTS

| | | | |
|---|---|---|---|
| 6,445,326 B1 * | 9/2002 | Donovan ................ | H03M 1/14 341/155 |
| 6,674,387 B1 * | 1/2004 | Ott ........................ | H03M 1/506 341/155 |
| 9,143,151 B2 * | 9/2015 | Park ....................... | H03M 1/18 |
| 9,240,776 B2 * | 1/2016 | Zimlich .................. | H03K 7/08 |

FOREIGN PATENT DOCUMENTS

WO 2008072130 A1 6/2008

OTHER PUBLICATIONS

Frank Leong, MSD Lab TechTalk: Secure RF Ranging, Oct. 16, 2013.
B. Murmann, "ADC Performance Survey 1997-2014," [Online]. Available: http://web.stanford.edu/~murmann/adcsurvey.html. 2012.
Chun-Ying Chen et al., "A 12b 3GS/s pipeline ADC with 500 mW and 0.4 mm2 in 40 nm Digital CMOS," 2011 Symposium on VLSI Circuits Digest of Technical Papers, pp. 120-121.
B. Setterberg et al., "A 14b 2.5GS/s 8-Way-Interleaved Pipelined ADC With Background Calibration and Digital Dynamic Linearity Correction," in IEEE Int. Solid-State Circuits Conf. (ISSCC) Dig. Tech. Papers, 2013, vol. 1, pp. 466-467.
P. J. A. Harpe , C. Zhou , Y. Bi , N. P. van der Meijs , X. Wang , K. Philips , G. Dolmans and H. de Groot "A 26 uW 8 bit 10 MS/s Asynchronous SAR ADC for Low Energy Radios", IEEE J. Solid-State Circuits, vol. 46, No. 7, pp. 1585-1595, 2011.

(Continued)

*Primary Examiner* — Brian Young
(74) *Attorney, Agent, or Firm* — Rajeev Madnawat

(57) ABSTRACT

Methods and systems for performing analog-to-digital conversion are described. In one embodiment, a method for performing analog-to-digital conversion involves processing an analog impulse signal to obtain an impulse pattern of the analog impulse signal in a first signal processing path and converting the analog impulse signal into a digital signal based on the impulse pattern in a second signal processing path that is in parallel with the first signal processing path. The impulse pattern of the analog impulse signal includes duty cycle information of the analog impulse signal. Other embodiments are also described.

20 Claims, 8 Drawing Sheets

(56) References Cited

OTHER PUBLICATIONS

M. van Elzakker et al., "A 10-bit Charge-Redistribution ADC Consuming 1.9 uW at 1 MS/s," IEEE JSSC, May 2010, pp. 1007-1015.

Y. Chai and J.-T. Wu, "A 5.37 mW 10b 200MS/s Dual-Path Pipelined ADC," in Solid-State Circuits Conference Digest of Technical Papers (ISSCC), 2012 IEEE International. IEEE, 2012, pp. 462-464.

* cited by examiner

METHOD AND SYSTEM FOR PERFORMING ANALOG-TO-DIGITAL CONVERSION

Embodiments of the invention relate generally to electrical systems and methods and, more particularly, to systems and methods for performing data conversions.

In a communications system, signal quality, such as signal-to-noise ratio (SNR) of digital signals, can be improved by increasing analog-to-digital converter (ADC) speed and resolution. However, increasing speed and resolution in an ADC can result in an increase in silicon area and power consumption of an Integrated Circuit (IC) chip. Typically, operating a high-speed ADC for various applications can result in high current consumption and/or a large chip area. In addition, the design complexity and power consumption of an ADC grow exponentially with the increase in accuracy and speed. Thus, communications systems with high-speed and high-resolution ADCs can be difficult to design and implement without large current consumption and chip area overhead.

Methods and systems for performing analog-to-digital conversion are described. In one embodiment, a method for performing analog-to-digital conversion involves processing an analog impulse signal to obtain an impulse pattern of the analog impulse signal in a first signal processing path and converting the analog impulse signal into a digital signal based on the impulse pattern in a second signal processing path that is in parallel with the first signal processing path. The impulse pattern of the analog impulse signal includes duty cycle information of the analog impulse signal. Other embodiments are also described.

In one embodiment, a system for performing analog-to-digital conversion include a detection device configured to process an analog impulse signal to obtain an impulse pattern of the analog impulse signal in a signal detection path and a burst-sampling device configured to convert the analog impulse signal into a digital signal based on the impulse pattern in a signal burst-sampling path that is in parallel with the signal detection path. The impulse pattern of the analog impulse signal includes duty cycle information of the analog impulse signal.

In one embodiment, a method for performing analog-to-digital conversion of an ultra wideband (UWB) signal involves processing the UWB signal to obtain an impulse pattern of the UWB signal that includes duty cycle information of the UWB signal in a signal detection path, successively sampling the UWB signal during an impulse period of the UWB signal based on the impulse pattern to generate sampled analog signals in a signal burst-sampling path that is in parallel with the signal detection path and successively converting the sampled analog signals into digital signals using ADCs in the signal burst-sampling path.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
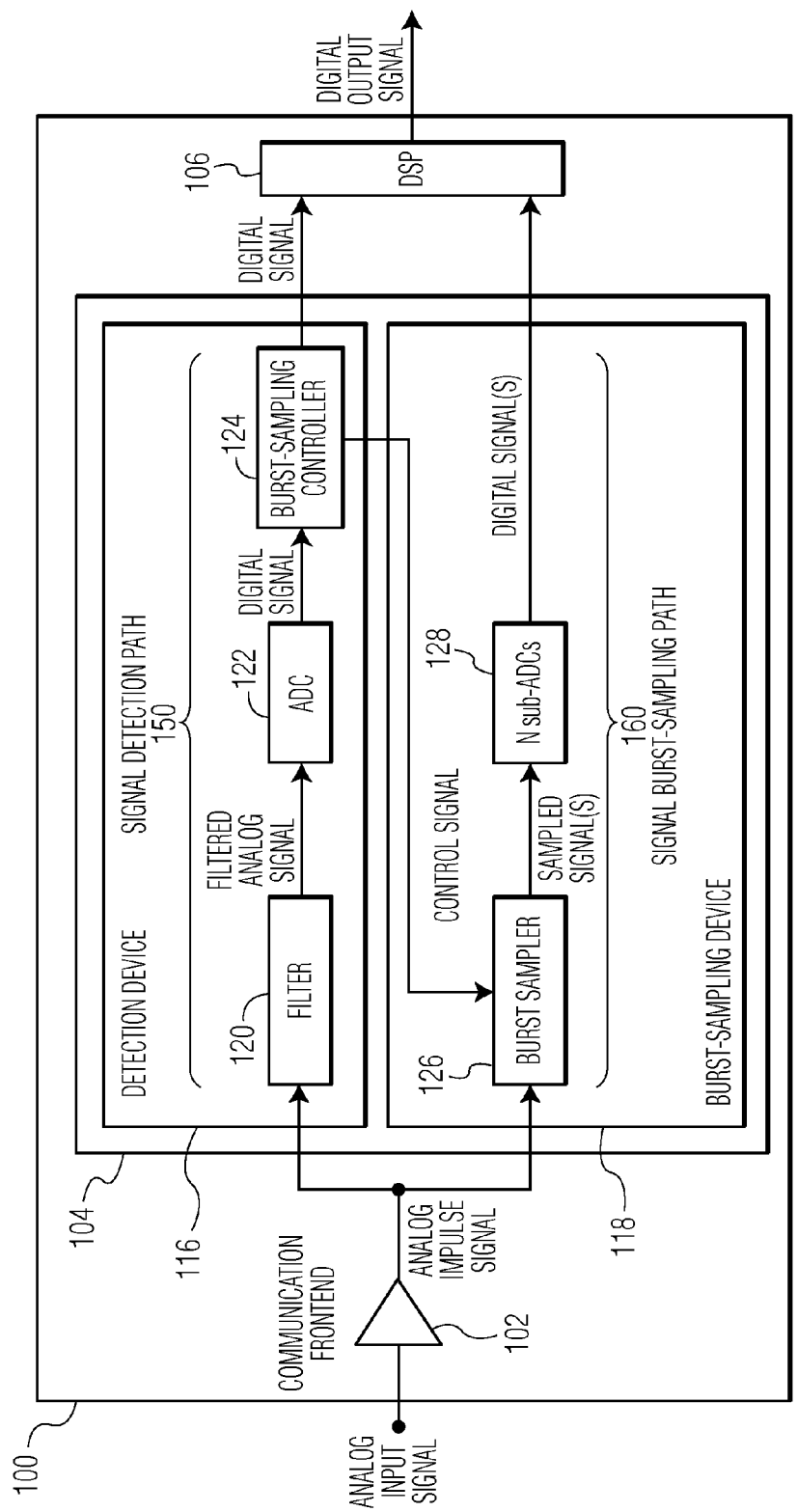
FIG. 1 is a schematic block diagram of a communication device in accordance with an embodiment of the invention.

FIG. 1 is a schematic block diagram of a communication device 100 in accordance with an embodiment of the invention. The communication device 100 is used to convert an analog input signal into a digital output signal. The communication device can be used for various applications. For example, the communication device can be used for Bluetooth communication, wireless local area network (WLAN)

communication, FM radio communication, digital audio broadcast (DAB), TV transmission, digital video broadcast (DVB), global system for mobile communications (GSM), enhanced data rates for GSM evolution (EDGE) communication, wideband code division multiple access (WCDMA) communication, universal mobile telecommunications system (UMTS), high speed packet access (HSPA) communication, ultra wideband (UWB) communication, ZigBee (IEEE 802.15), and RFID (radio frequency identification) communication. In some embodiments, the communication device is implemented based on UWB impulse radio technology, which uses pulses with nano/subnano-second duration to transmit information. In these embodiments, the communication device is a digital UWB receiver, which offers significant benefits ranging from lower cost, more flexibility, as well as the opportunity to utilize complex digital signal processing to operate in environments with higher level of interference and noise. In some embodiments, the communication device is used for an automotive application. In an embodiment, the communication device is implemented in an automotive key or controller to control a vehicle or an RF receiver/transmitter within a vehicle. For example, the communication device can be used in a vehicle immobilizer and/or a vehicle remote and/or passive keyless entry system.

In the embodiment depicted in FIG. 1, the communication device 100 includes a communication frontend 102, an ADC system 104 and a digital signal processor (DSP) 106. Although the communication device is shown in FIG. 1 as including certain components, in some embodiments, the communication device includes more or fewer components to implement more or fewer functionalities. For example, the communication device may include at least one antenna.

The communication frontend 102 of the communication device 100 is configured to process an analog input signal. In some embodiments, the communication frontend processes analog signals from at least one antenna. The communication frontend can be used to convert an analog input signal from a higher carrier frequency to a lower frequency. In some embodiments, the communication frontend includes an impedance matching circuit, an amplifier, an oscillator, and/ or a mixer. In an embodiment, the communication frontend is an RF frontend that converts an RF input signal with a higher carrier frequency to an intermediate frequency (IF) signal with a lower frequency than the carrier frequency of the RF input signal. In some embodiments, the communication frontend is an RF frontend that includes an amplifier and a mixer that is connected to the output of the amplifier.

Figure 2:
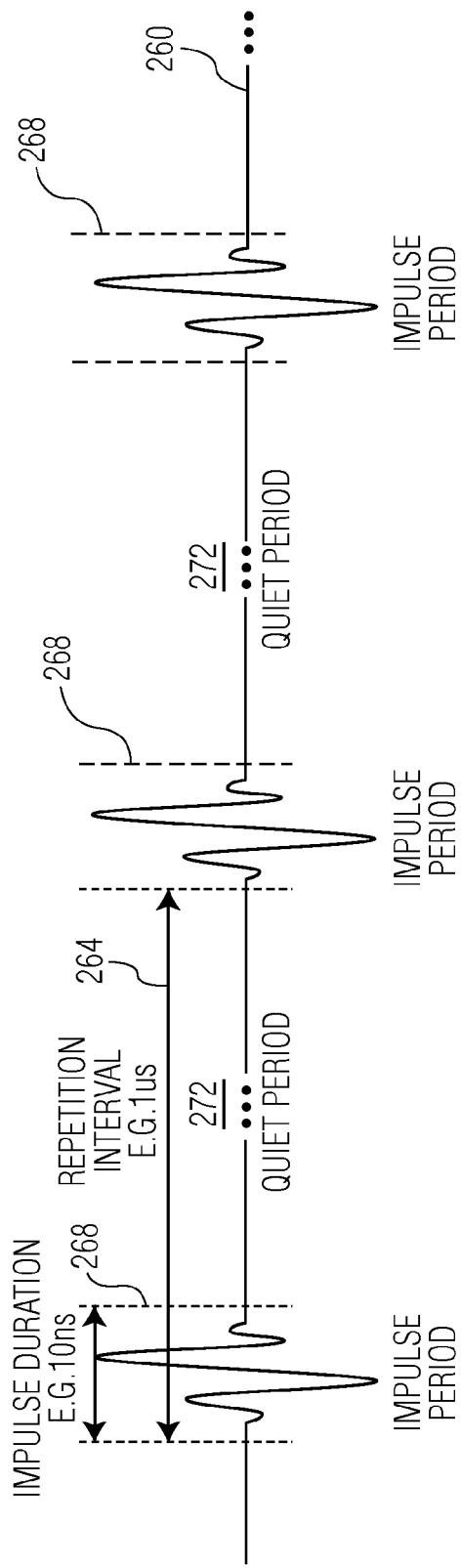
FIG. 2 depicts an example of an impulse analog signal from the communication frontend of the communication device depicted in FIG. 1.

In some embodiments, the analog signal from the communication frontend 102 is an impulse signal that has a strong scarcity (sparseness) in the time domain. In an embodiment, the analog signal has a low duty cycle. In an embodiment, the duty cycle of the analog signal is the percentage of time that the analog signal has an active state (e.g., a time period in which the value of the impulse signal or its envelope fluctuates or is non-zero) as a fraction of the total time under consideration, which can be one clock time period of a clock signal or a multiple of one clock time period of a clock signal. FIG. 2 depicts an example of an impulse analog signal 260 from the communication frontend 102. As shown in FIG. 2, the impulse signal has a repetition/impulse interval 264 (i.e., a cycle) in which the impulse signal has identical values. Each repetition interval of the impulse signal depicted in FIG. 2 has an impulse period 268 in which the value of the impulse signal fluctuates and a quiet period 272 in which the value of the impulse signal is zero. In an embodiment, a repetition interval of the impulse signal is 1 microsecond (μs) while the impulse period of the impulse signal is 10 nanoseconds (ns). In this embodiment, the impulse period of the impulse signal takes only 1% of the pulse interval of the impulse signal.

The ADC system 104 of the communication device 100 uses a burst sampling approach to sample an analog impulse signal from the communication frontend 102 that has a strong scarcity in the time domain to generate time-discrete amplitude-continuous signals. Compared to a typical ADC system that samples the impulse signal continuously, a burst sampling approach can be used for an analog impulse signal to reduce the sampling activity and hence reduce power consumption. The ADC system can uses multiple of power-efficient ADCs (e.g., a combination of low-speed/medium-resolution and medium-speed/low-resolution ADCs) with high over-sampling ratios to replace a power hungry high-speed and high-resolution general purpose ADC in a typical ADC system that continuously samples an impulse signal while achieving a similar system performance as a typical ADC system.

Figure 3:
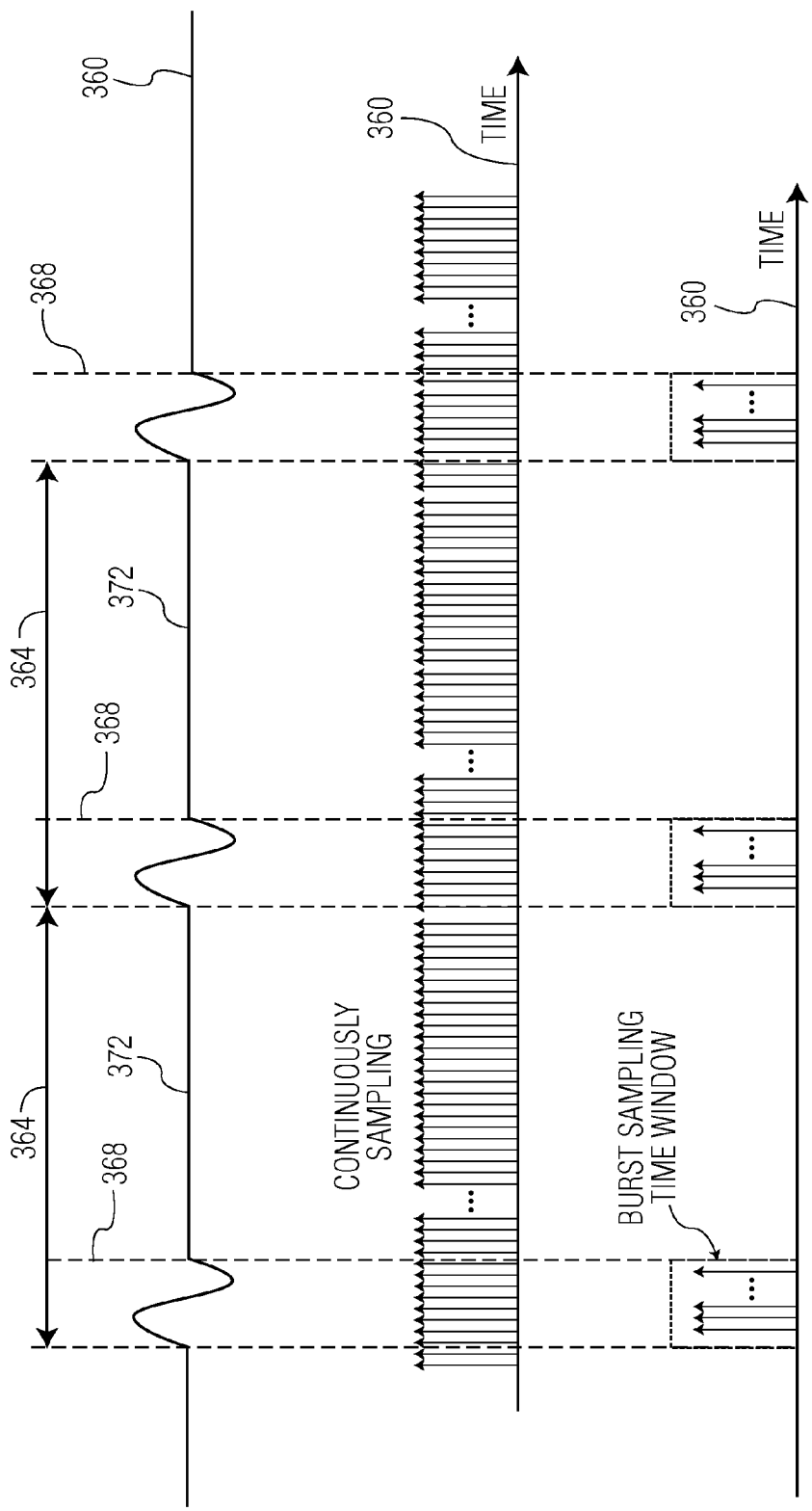
FIG. 3 depicts a continuous sampling scheme of an impulse analog signal and a burst sampling of the impulse analog signal device in accordance with an embodiment of the invention.

FIG. 3 depicts a continuous sampling of an impulse analog signal 360 performed by a typical ADC system and a burst sampling of the impulse analog signal performed by the ADC system 104 of FIG. 1. As shown in FIG. 3, in a typical ADC system, the impulse signal is sampled continuously during an impulse period 368 of each cycle 364 of the impulse signal in which the value of the impulse signal fluctuates and a quiet period 372 of each cycle of the impulse signal in which the value of the impulse signal is zero. The ADC system 104 does not sample the impulse signal during the quiet period 368 of each cycle 364 of the impulse signal. In the ADC system 104 of FIG. 1, the impulse signal is sampled only during the impulse period 368 of each cycle of the impulse signal. Compared to the continuous sampling approach, the impulse sampling approach can be performed with a lower sample frequency, and consequently, can reduce the sampling activity and hence reduce power consumption.

Turning back to FIG. 1, the ADC system 104 includes a detection device 116 for detecting an impulse pattern of an analog impulse signal from the communication frontend 102 in a signal detection path 150 and a burst-sampling device 118 for converting the analog impulse signal into digital form based on the detected impulse pattern from the detection device in a signal burst-sampling path 160 that is in parallel with the signal detection path. The impulse pattern indicates the grid or space onto which the analog data is modulated. For example, the impulse pattern of the analog impulse signal includes duty cycle information of the analog impulse signal. The ADC system can be used with On-off keying (OOK), Amplitude-shift keying (ASK), Pulse-position modulation (PPM), Binary Phase-shift keying (BPSK), N-PSK or any other form of modulation. The ADC system can also be used with dithering techniques which vary the length of the silence between pulses. The ADC system exploits the time domain property of the analog impulse signal and uses a combination of techniques, which include burst sampling, fast detection and self-synchronization, to reduce the power consumption substantially (e.g., around 90%) compared to a typical ADC system that continuously samples an impulse signal while achieving a similar system performance. For example, the ADC system 104 may have a power consumption that is below 50 milliwatt (mW) while a typical ADC system using a high-speed/medium-resolution ADC has a power consumption that is above 500 mW. Although the ADC system is shown in FIG. 1 as being used with the communication frontend and the DSP 106, in some embodiments, the ADC system 104 is used without the communication frontend and/or the DSP. For example, the ADC system may be used to process analog signals directly from an antenna.

The detection device 116 of the ADC system 100 is used to detect the presence of impulses in an analog impulse signal from the communication frontend 102 and setup pulse gate windows for the burst-sampling device 118, and includes a filter 120, an analog-to-digital converter (ADC) 122 and a burst-sampling controller 124. In the embodiment depicted in FIG. 1, the detection device generates a control signal for the burst-sampling device that contains information regarding the impulse pattern of an analog impulse signal from the communication frontend 102 and a digital signal that is supplied to the DSP 106.

Figure 4:
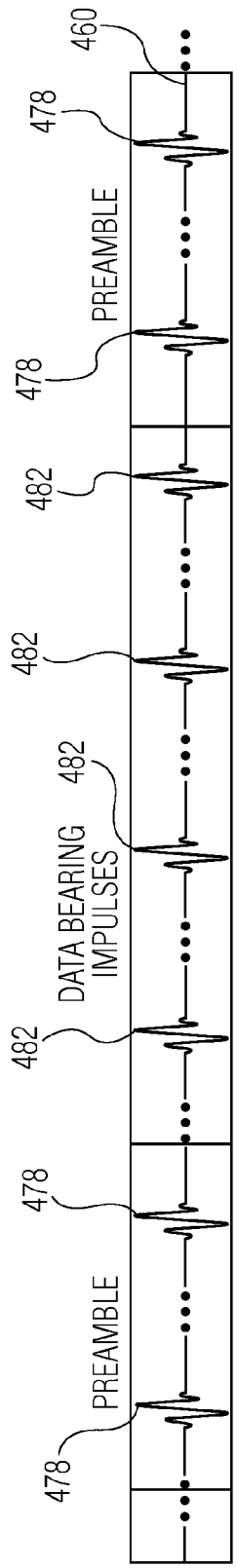
FIG. 4 depicts an example of the analog impulse signal from the communication frontend of the communication device depicted in FIG. 1 that includes preambles and data load impulses.

In some embodiments, the detection device 116 detects the pattern of impulses in the analog impulse signal from the communication frontend 102 by detecting and processing the preambles of the analog impulse signal, and uses the preamble information for synchronizing the burst sampling time window with the data/information bearing impulses. FIG. 4 depicts an example of the analog impulse signal from the communication frontend that includes preambles and data load impulses. As shown in FIG. 4, an analog impulse signal 460 from the communication frontend 102 includes preambles 478 and data bearing pulses 482. Each preamble contains a few pilot pulses prior to a corresponding data bearing pulse. The burst-sampling controller 124 can detect the impulse pattern of the analog impulse signal 460 based on preambles of the analog impulse signal.

Turning back to FIG. 1, the filter 120 of the detection device 116 is configured to filter the analog impulse signal from the communication frontend 102 to generate a filtered analog signal. In some embodiments, the filter is configured to broaden or stretch incoming pulses to relax the timing resolution requirement for the DAC. For example, the analog impulse signal is an intermediate frequency (IF) signal and the filter is a low-pass filter configured to filter out high frequency component of the IF signal. In an embodiment, the filter includes a transimpedance amplifier (TIA) and an input resistor, which is used for gain control or to insert a zero in the transfer function when desired.

The ADC 122 of the detection device is configured to convert the filtered analog signal that is generated by the filter 120 into a digital signal. For example, the ADC can convert an analog signal with certain amplitude and phase into a digital signal with a corresponding number of bits. The conversion speed and resolution of the ADC does not need to be set as high as an ADC that continuously samples an impulse analog signal. Consequently, the design complexity, component costs, power consumption and substrate area of the ADC can be reduced, compared to a typical ADC that continuously samples an impulse signal.

The burst-sampling controller 124 of the detection device 116 is configured to detect the presence of impulses in the digital signal from the ADC 122 and supply a control signal to the burst-sampling device 118 based on the detected information. In some embodiments, the burst-sampling controller detects the duty cycle of the digital signal. In some embodiments, the burst-sampling controller detects the impulse (active) period in which the value of the digital signal fluctuates or is non-zero and the quiet (inactive) period in which the value of the digital signal is zero. In some embodiments, the burst-sampling controller detects the pattern of impulses in the digital signals by detecting and processing the preambles of the digital signal, and uses the preamble information for synchronizing the burst sampling time window with the information bearing impulses. Based on information gathered by the burst-sampling controller, the activity of the burst sampling device can be adapted according to the signal to reduce unnecessary power consumption. In addition, the burst windows may be non-equidistant due to dithering, which is the intentional variation in the pulse repetition period to avoid peaks in the signal spectrum. For example, the burst windows may be non-equidistant due to dithering implemented in the IEEE802.15.4a standard.

The burst-sampling device 118 of the ADC system 104 includes a burst sampler 126 and multiple sub-ADCs 128-1, 128-2, . . . , 128-N, where N is an integer that is larger than 1, that are connected to the burst sampler. The burst sampler of the detection device is configured to perform burst-sampling to an analog impulse signal from the communication frontend 102 to generate at least one sampled analog signal. In some embodiments, the impulse pattern of the analog impulse signal includes duty cycle information of the analog impulse signal. The sub-ADCs of the detection device are configured to convert the sampled analog signal from the burst sampler into at least one digital signal based on an impulse pattern of the analog impulse signal from the communication frontend. In some embodiments, the sub-ADCs operate in an interleaved fashion such as to enable low per-unit conversion rate and therefore high energy efficiency for all sub-ADCs. In an embodiment, the burst sampler is configured to successively sample the analog impulse signal from the communication frontend during an impulse period of the analog impulse signal to generate multiple sampled signals. In this embodiment, the sub-ADCs are configured to successively convert the sampled signals into digital signals in the order in which the analog impulse signal is sampled during the impulse period. The conversion speed and resolution of the sub-ADCs does not need to be set as high as an ADC that continuously samples an impulse analog signal. Consequently, the design complexity, component costs, power consumption and substrate area of the sub-ADCs can be reduced, compared to a typical ADC that continuously samples an impulse signal.

Figure 5:
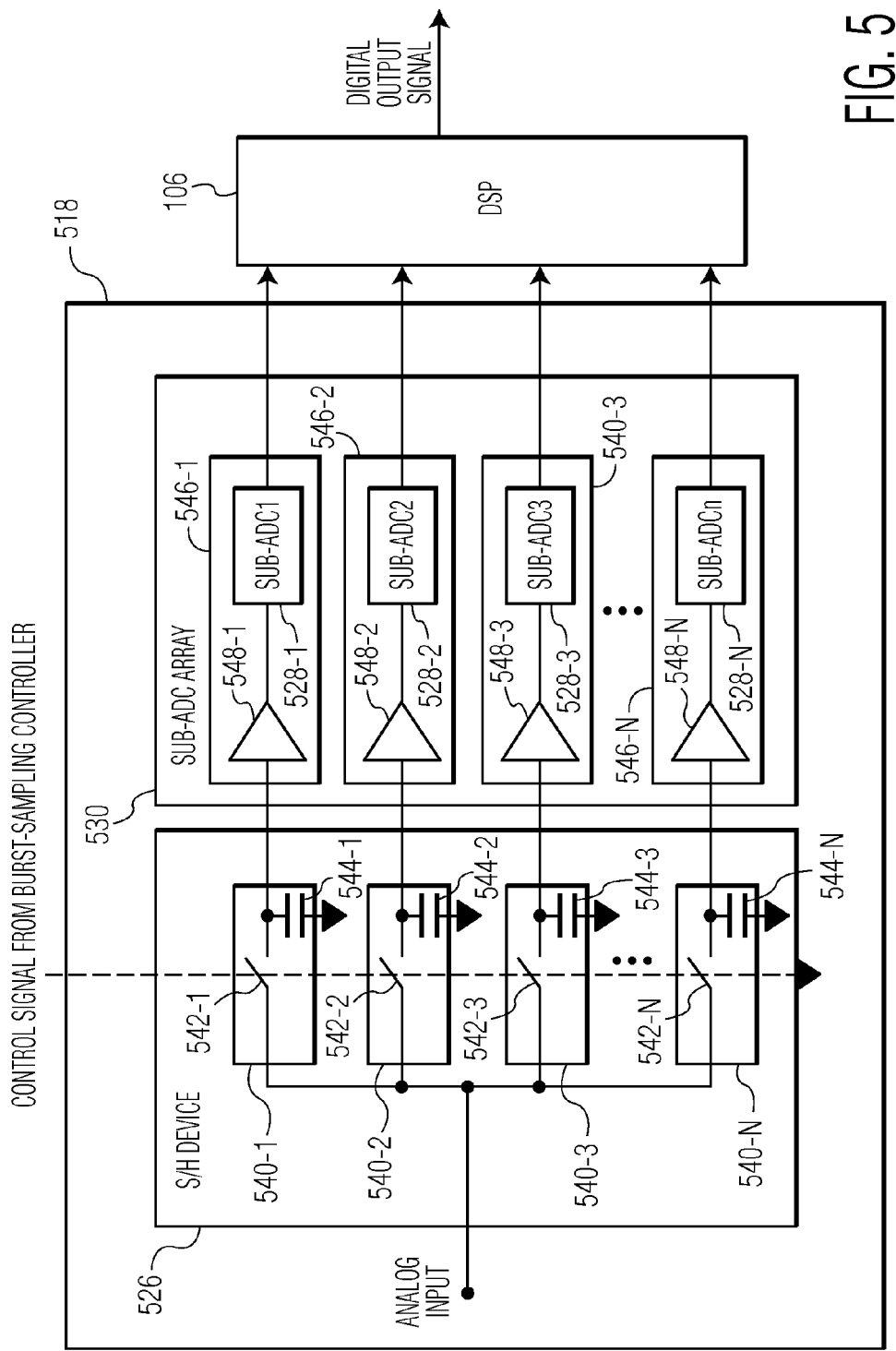
FIG. 5 depicts an embodiment of the burst-sampling device of the communication device depicted in FIG. 1.

In some embodiments, the burst-sampling device 118 is realized by a high-speed sample-and-hold (S/H) circuit such that the information carried by an analog impulse signal from the communication frontend 102 can be captured with fine timing resolution and samples are subsequently digitized using low-speed/medium-resolution ADCs. By taking advantage of the long inactive period of the signal, the conversion speed of the ADC can be relaxed for further power saving as the power-speed trade-off becomes nonlinear as the frequency exceeds a certain limit. FIG. 5 depicts an embodiment of the burst-sampling device depicted in FIG. 1 that includes a high-speed sample-and-hold (S/H) device 526 and a low-speed/medium-resolution sub-ADC array 530. The burst-sampling device 518 depicted in FIG. 5 is one of the possible implementations of the burst-sampling device depicted in FIG. 1. However, the burst-sampling device depicted in FIG. 1 can be implemented differently from the burst-sampling device depicted in FIG. 5. The invention is not restricted to the particular implementation of the burst-sampling device depicted in FIG. 5.

The S/H device 526 of the burst-sampling device 518 operates in a burst sampling manner and includes a number of S/H circuits 540-1, 540-2, . . . , 540-N, where N is an integer that is larger than 1. Each S/H circuit includes a switch 542-1, 542-2, . . . , or 542-N, which is controlled by the control signal from the burst-sampling controller 124 (shown in FIG. 1) of the detection device 116 (shown in FIG. 1), which includes information regarding the impulse pattern of the analog impulse signal from the communication frontend 102, and a capacitor 544-1, 544-2, . . . , or 544-N. Each S/H circuit is used to generate a sampled signal for a corresponding sub-ADC 528 of the low-speed/medium-resolution sub-ADC array 530. The switches and capacitors may be connected to a low voltage terminal, such as the ground. In an embodiment, the S/H circuit 540-1 for the sub-ADC 1 does not need to operate again right after the operation of the S/H circuit 540-n for the sub-ADC n, where n is an integer that is larger than 1 and less than N.

The low-speed/medium-resolution sub-ADC array 530 includes a number of sub-ADC circuits 546-1, 546-2, ..., 546-N, where N is an integer that is larger than 1. Each sub-ADC circuit includes an amplifier 548-1, 548-2, ..., or 548-N, and a sub-ADC 528-1, 528-2, ..., or 528-N, and is controlled by a corresponding S/H circuit 540 of the high-speed S/H device 526. The sub-ADCs can make use of the inactive period of the signal for conversion (e.g. the burst sampling period is about 30 ns while the pulse interval is around 250 ns). Because of the relaxed conversion speed requirement for the sub-ADC, the sub-ADC can be realized by power efficient switched-capacitor successive approximation (SAR) ADC. The digital signals received from the sub-ADCs of the sub-ADC array can be reconstructed by the DSP 106.

Figure 6:
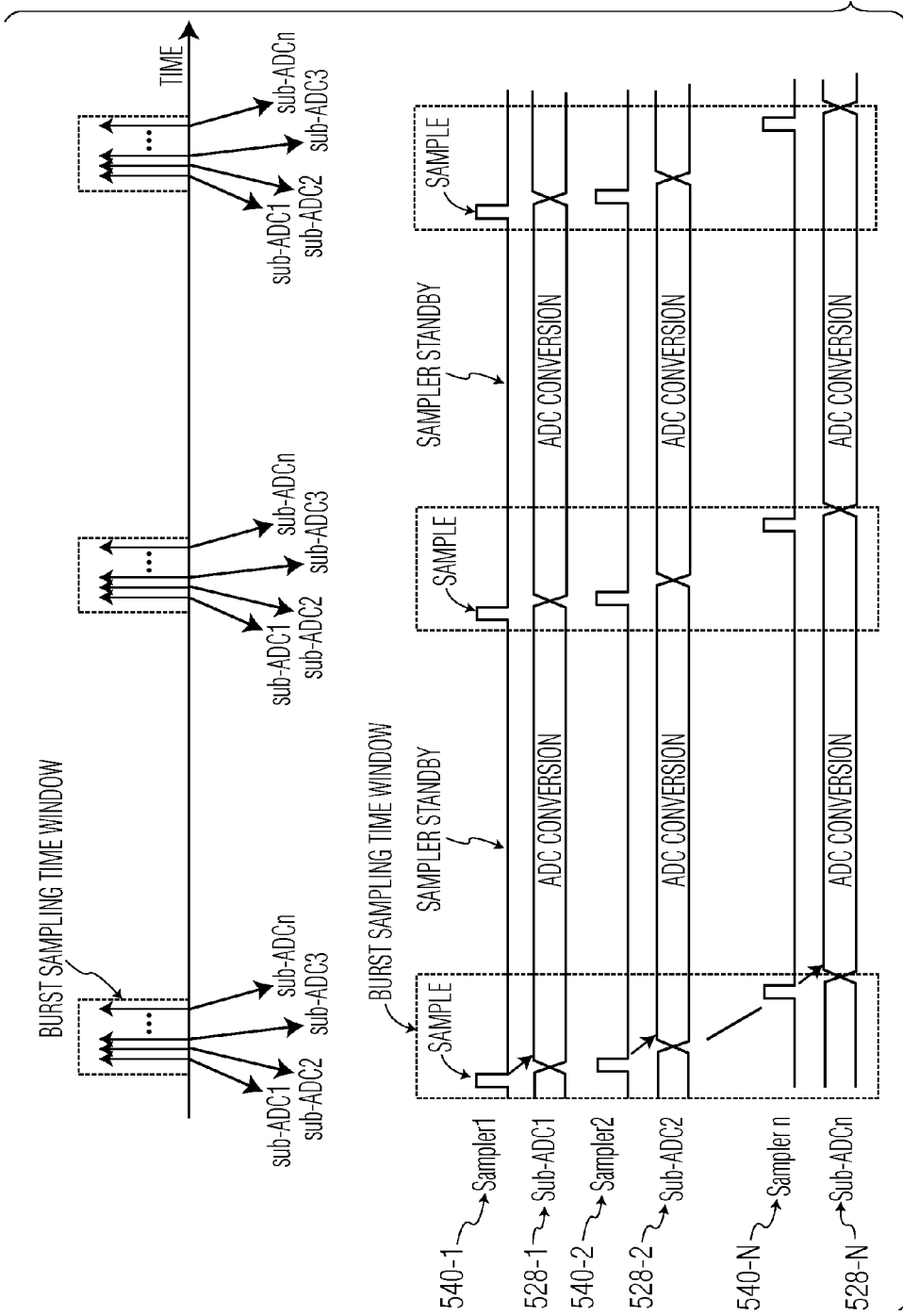
FIG. 6 shows a signal timing diagram for the burst-sampling device depicted in FIG. 5.

FIG. 6 shows a signal timing diagram for the burst-sampling device 518 depicted in FIG. 5. As shown in the upper section of the signal timing diagram depicted in FIG. 6, each S/H circuit 540 serially performs signal sampling for a corresponding sub-ADC 528 (sub-ADC1 ... or Sub-ADCn) in each burst sampling time window. As shown in the lower section of the signal timing diagram depicted in FIG. 6, in each burst sampling time window, firstly the S/H circuit 540-1 samples the impulse signal, subsequently, the S/H circuit 540-2 samples the impulse signal, and lastly the S/H circuit 530-n samples the impulse signal. The time interval between the sampling performed by any two S/H circuits may be zero or be set to any suitable time duration.

Turning back to FIG. 1, the ADC system 104 can use multiple power-efficient ADCs (e.g., a combination of low-speed/medium-resolution and medium-speed/low-resolution ADCs with oversampling) to replace a power hungry high-speed and high-resolution general purpose ADC. In some embodiments, the ADC system includes an ADC 122 with medium speed and low resolution, a high speed sampling burst-sampler 126, and multiple sub-ADCs 128 with low speed and moderate resolution. For example, the ADC 122 has a conversion speed of A samples/second and a conversion resolution of B bits, the sampling burst-sampler has a sample speed of C samples/second, and each sub-ADC has a conversion speed of D samples/second and a conversion resolution of E bits (A, B, C, D, E are positive integers), where D is smaller than A, which is smaller than C, and where B is smaller than E when the sampling burst-sampler enables oversampling to a degree that is impossible in traditional ADC systems.

The DSP 106 of the communication device 100 is configured to process digital signals from the ADC system 104. In some embodiments, the DSP is used to reconstruct digital signals received from the sub-ADCs 128 of the burst-sampling device 118 of the ADC system 104. The DSP can be implemented in hardware, software stored on a computer readable medium (e.g., memory or cache), firmware, or a combination of hardware, software and/or firmware.

Figure 7:
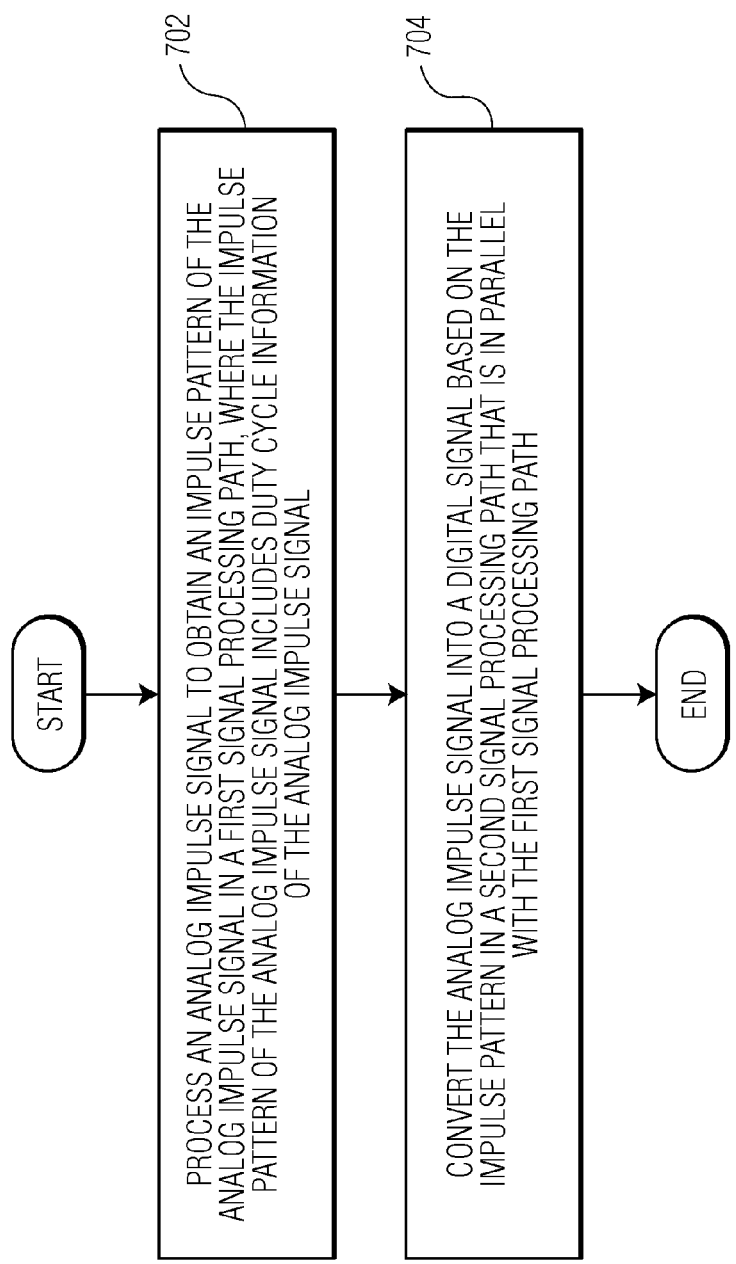
FIG. 7 is a process flow diagram of a method for performing analog-to-digital conversion in accordance with an embodiment of the invention.

FIG. 7 is a process flow diagram of a method for performing analog-to-digital conversion in accordance with an embodiment of the invention. At block 702, an analog impulse signal is processed to obtain an impulse pattern of the analog impulse signal in a first signal processing path. The impulse pattern of the analog impulse signal includes duty cycle information of the analog impulse signal. At block 704, the analog impulse signal is converted into a digital signal based on the impulse pattern in a second signal processing path that is in parallel with the first signal processing path.

Figure 8:
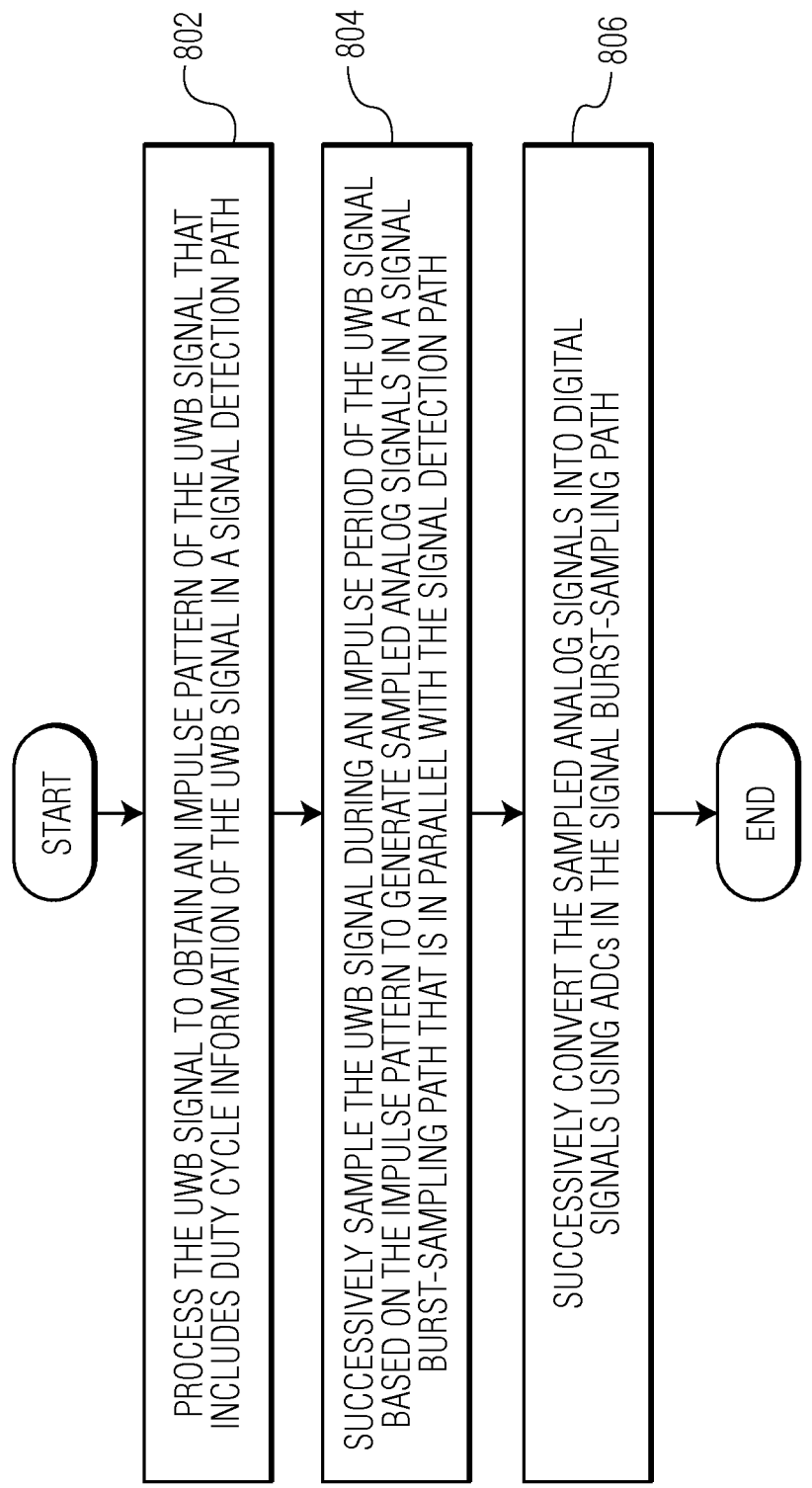
FIG. 8 is a process flow diagram of a method for performing analog-to-digital conversion of an ultra wideband (UWB) signal in accordance with an embodiment of the invention.

FIG. 8 is a process flow diagram of a method for performing analog-to-digital conversion of an UWB signal in accordance with an embodiment of the invention. At block 802, the UWB signal is processed to obtain an impulse pattern of the UWB signal that includes duty cycle information of the UWB signal in a signal detection path. At block 804, the UWB signal is successively sampled during an impulse period of the UWB signal based on the impulse pattern to generate sampled analog signals in a signal burst-sampling path that is in parallel with the signal detection path. At block 806, the sampled analog signals are successively converted into digital signals using analog-to-digital converters (ADCs) in the signal burst-sampling path.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement fewer or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for performing analog-to-digital conversion, the method comprising:
    processing an analog impulse signal to obtain an impulse pattern of the analog impulse signal in a first signal processing path, wherein the impulse pattern of the analog impulse signal comprises duty cycle information of the analog impulse signal; and
    converting the analog impulse signal into a digital signal based on the impulse pattern in a second signal processing path that is in parallel with the first signal processing path.

2. The method of claim 1, wherein converting the analog impulse signal into the digital signal based on the impulse pattern in the second signal processing path comprises:
    burst-sampling the analog impulse signal based on the impulse pattern to generate a sampled analog signal; and
    converting the sampled analog signal into the digital signal using a plurality of analog-to-digital converters (ADCs).

3. The method of claim 2, wherein burst-sampling the analog impulse signal based on the impulse pattern to generate the sampled analog signal comprises: sampling the analog impulse signal only during an impulse period of the analog impulse signal.

4. The method of claim 2, wherein burst-sampling the analog impulse signal based on the impulse pattern to generate the sampled analog signal comprises:
    sampling the analog impulse signal only during an impulse period of the analog impulse signal in which the value of the analog impulse signal fluctuates based on the impulse pattern; and
    deciding not to sample the analog impulse signal during a quiet period in which the value of the analog impulse signal is zero based on the impulse pattern.

5. The method of claim 2, wherein burst-sampling the analog impulse signal based on the impulse pattern to generate the sampled analog signal comprises:
   sampling the analog impulse signal a plurality of times during an impulse period of the analog impulse signal to generate a plurality of sampled signals; and
   converting the sampled signals into a plurality of digital signals using the ADCs.

6. The method of claim 2, wherein burst-sampling the analog impulse signal based on the impulse pattern to generate the sampled analog signal comprises:
   successively sampling the analog impulse signal during an impulse period of the analog impulse signal to generate a plurality of sampled signals; and
   successively converting the sampled signals into a plurality of digital signals using the ADCs.

7. The method of claim 2, wherein processing the analog impulse signal to obtain the impulse pattern of the analog impulse signal in the first signal processing path comprises:
   filtering the analog impulse signal to generate a filtered analog signal;
   converting the filtered analog signal into a second digital signal; and
   detecting a presence of impulses in the second digital signal to identify the impulse pattern of the analog impulse signal.

8. The method of claim 2, wherein processing the analog impulse signal to obtain the impulse pattern of the analog impulse signal in the first signal processing path comprises detecting the impulse pattern of the analog impulse signal based on a preamble of the analog impulse signal.

9. The method of claim 1, further comprising converting a radio frequency (RF) signal into the analog impulse signal, wherein the analog impulse signal comprises an intermediate frequency (IF) signal with a frequency that is lower than the carrier frequency of the RF signal.

10. The method of claim 9, wherein the RF signal comprises an ultra wideband (UWB) signal.

11. A system for performing analog-to-digital conversion, the system comprising:
   a detection device configured to process an analog impulse signal to obtain an impulse pattern of the analog impulse signal in a signal detection path, wherein the impulse pattern of the analog impulse signal comprises duty cycle information of the analog impulse signal; and
   a burst-sampling device configured to convert the analog impulse signal into a digital signal based on the impulse pattern in a signal burst-sampling path that is in parallel with the signal detection path.

12. The system of claim 11, wherein the burst-sampling device comprises:
   a sampling device configured to burst-sample the analog impulse signal based on the impulse pattern to generate a sampled analog signal; and
   a plurality of analog-to-digital converters (ADCs) configured to convert the sampled analog signal into the digital signal.

13. The system of claim 12, wherein the sampling device is further configured to successively sample the analog impulse signal during an impulse period of the analog impulse signal to generate a plurality of sampled signals, and wherein the ADCs are further configured to successively convert the sampled signals into a plurality of digital signals.

14. The system of claim 12, wherein the detection device comprises:
   a filter configured to filter the analog impulse signal to generate a filtered analog signal;
   a second analog-to-digital converter (ADC) configured to convert the filtered analog signal into a second digital signal; and
   a burst-sampling controller configured to detect a presence of impulses in the second digital signal to identify the impulse pattern of the analog impulse signal.

15. The system of claim 14, wherein the burst-sampling controller is further configured to detect the impulse pattern of the analog impulse signal based on a preamble of the analog impulse signal.

16. The system of claim 11, wherein the burst-sampling device is configured to sample the analog impulse signal only during an impulse period of the analog impulse signal.

17. The system of claim 11, wherein the burst-sampling device is configured to sample the analog impulse signal only during an impulse period of the analog impulse signal in which the value of the analog impulse signal fluctuates based on the impulse pattern and decide not to sample the analog impulse signal during a quiet period in which the value of the analog impulse signal is zero based on the impulse pattern.

18. The system of claim 11, further comprising a communication frontend configured to convert a radio frequency (RF) signal into the analog impulse signal, wherein the analog impulse signal comprises an intermediate frequency (IF) signal with a frequency that is lower than the carrier frequency of the RF signal.

19. The system of claim 18, wherein the RF signal comprises an ultra wideband (UWB) signal.

20. A method for performing analog-to-digital conversion of an ultra wideband (UWB) signal, the method comprising:
   processing the UWB signal to obtain an impulse pattern of the UWB signal that comprises duty cycle information of the UWB signal in a signal detection path;
   successively sampling the UWB signal during an impulse period of the UWB signal based on the impulse pattern to generate a plurality of sampled analog signals in a signal burst-sampling path that is in parallel with the signal detection path; and
   successively converting the sampled analog signals into a plurality of digital signals using a plurality of analog-to-digital converters (ADCs) in the signal burst-sampling path.

* * * * *